United States Patent [19]
Jacob

[11] 3,951,709
[45] Apr. 20, 1976

[54] PROCESS AND MATERIAL FOR SEMICONDUCTOR PHOTOMASK FABRICATION

[75] Inventor: Adir Jacob, Framingham, Mass.

[73] Assignee: LFE Corporation, Waltham, Mass.

[22] Filed: Feb. 28, 1974

[21] Appl. No.: 446,931

[52] U.S. Cl. .................................. 156/8; 204/164; 252/79.2
[51] Int. Cl.[2] .................... B29C 17/08; C23F 1/02; C09K 13/04
[58] Field of Search .................. 156/2, 17, 8, 18; 252/79.1, 79.2, 79.3, 79.4, 372; 204/192, 164, 169, 170

[56] References Cited
UNITED STATES PATENTS

| | | | |
|---|---|---|---|
| 2,689,217 | 9/1954 | Cotton | 204/164 |
| 3,419,351 | 12/1968 | Zirngibl et al. | 204/164 |
| 3,429,793 | 2/1969 | Hellund | 204/164 |
| 3,477,936 | 11/1969 | Gillery et al. | 204/164 |
| 3,481,703 | 12/1969 | Zirngibl et al. | 205/164 |
| 3,615,956 | 10/1971 | Irving et al. | 156/17 |
| 3,654,108 | 4/1972 | Smith, Jr. | 204/164 |
| 3,668,095 | 6/1972 | Hisao Katto et al. | 204/164 |
| 3,795,557 | 3/1974 | Jacob | 156/8 |

*Primary Examiner*—William A. Powell
*Assistant Examiner*—Brian J. Leitten
*Attorney, Agent, or Firm*—Kenway & Jenney

[57] ABSTRACT

A process step and material for use in the manufacture of semiconductor photomasks. To facilitate the etching of unmasked chromium, gold, and other metals capable of forming oxychloride derivatives on preselected portions of a substrate material, the material is exposed to a low pressure rf generated "cold" plasma (under 300°C) produced from a homogeneous gaseous mixture of oxygen and a halogen containing compound.

27 Claims, 2 Drawing Figures

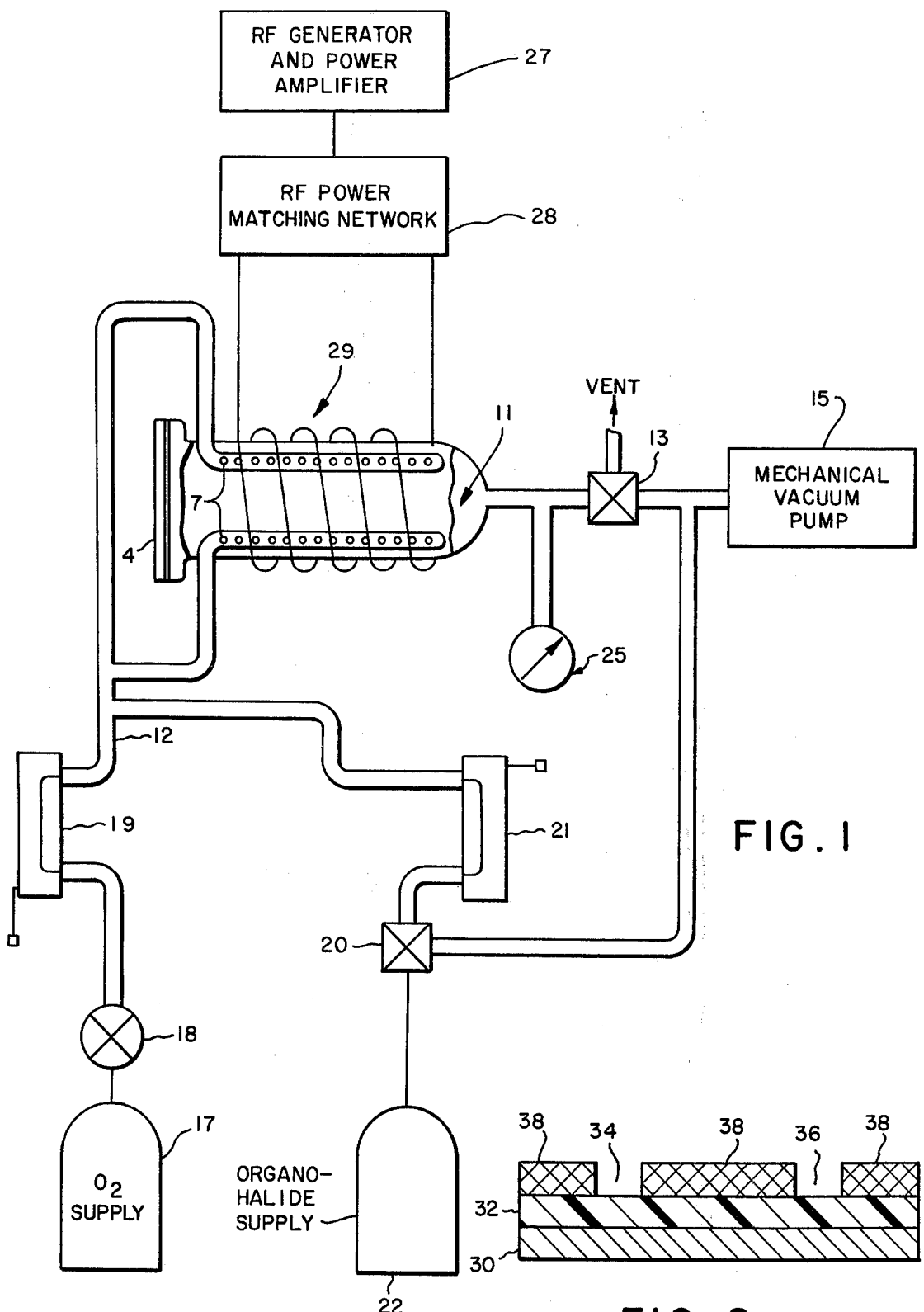

PROCESS AND MATERIAL FOR SEMICONDUCTOR PHOTOMASK FABRICATION

FIELD OF THE INVENTION

This invention relates in general to a process and material useful in analytical procedures, and more particularly to a process and material useful in the manufacture of semi-conductor photomasks, enabling the etching of various metals (chromium, gold, etc.) capable of forming volatile oxychloride derivatives.

BACKGROUND OF THE INVENTION

In the conventional technique for the fabrication of semiconductor photomasks, a glass plate, after being thoroughly cleaned, accepts a relatively thin layer, typically 600 to 800A, of a metal film vapor-deposited or sputtered on one of its surfaces. A layer of photoresist material is then spun on to the metallic layer, and is subsequently exposed to UV light through a master emulsion mask having openings corresponding to those areas where it is desired to subsequently generate semiconductor junctions, etc. After exposure of the photoresist material through the emulsion mask, the mask is removed and the layer of photoresist is developed and processed by means of a suitable solvent, exposing select areas of the underlying metallic layer. A wet acid-based dip is then used to etch the metallic film from the surface of the glass plate in the exposed areas, the remaining photoresist material serving as an etchmask for the surface covered by it. Following the wet etching process, a water rinse and a drying step are implemented. The remainder of the photoresist material is subsequently removed via an organic solvent dip, followed by an inorganic acid dip required for the removal of inorganic residues commonly embedded in resist material. The photoresist material along with its associated inorganic contaminants can also be removed by a plasma process utilizing the halocarbon-oxygen gaseous mixtures disclosed by the present inventor in his U.S. patent application Ser. No. 173,537, filed Aug. 20, 1971. Following a further water rinse and a drying cycle, the semiconductor photomasks are packaged and stored away from any excessive moisture and destructive dust particles.

Among the problems and drawbacks associated with the metal wet-etching step used in the above-mentioned technique are:

1. Physical degradation of the photoresist etch mask caused by lifting.
2. Enhanced undercutting effects creating undesirable slops of the etched channel.
3. Impairment of line-line resolution due to (1) and-/or (2).
4. Severe and rapid chemical degradation of the metalized layer imposing stringent process control requirements.
5. Requirement for post-etch water rinse and drying steps, invariably increasing handling procedures and correspondingly reducing production yields.
6. Short shelf-life of etching solution due to inevitable contamination.
7. Generally very hazardous to personnel and undesirably polluting.

Accordingly, the general object of the present invention is to provide an improved process and new material that overcome the aforementioned problems and provide uniform etching reactions at a moderate and controllable rate.

SUMMARY OF THE INVENTION

Broadly speaking in the present invention there is provided a gas discharge flow apparatus adapted to form a gaseous plasma within a reaction chamber. It has been discovered that if the generated plasma comprises reactive species resulting from the excitation and decomposition of a gaseous mixture of oxygen and a chlorinated compound, metallized layers (e.g., chromium, gold, etc.) can be etched in excess of a few hundred Angstrom per minute without the concomitant degradation of an organic photoresist etch mask. While the above etch rates are commensurate with the preservation of an organic photoresist etch mask in this chemically hostile environment, appreciably higher etch rates of the metal can be achieved grossly — in the absence of any organic mask.

DESCRIPTION OF THE DRAWING

In the drawing:

FIG. 1 is an illustration in diagrammatic form of a gas discharge flow system useful in the process of this invention; and FIG. 2 is an illustration in cross-sectional view of a typical semiconductor photomask at an intermediate state of its fabrication process.

DESCRIPTION OF PREFERRED EMBODIMENT

FIG. 1 depicts diagrammatically an apparatus performing the process described in the invention. The apparatus includes a reactor chamber 11, typically made of quartz, having a cover 4 and a gas inlet manifold 12. The side of the reactor 11 has been partially broken away in the drawing so as to better illustrate the gas diffusion tubes 7 which are disposed therein and are externally connected to manifold 12. Such a reactor is disclosed in U.S. Pat. No. 3,619,402, issued on Nov. 9, 1971, and assigned to LFE Corporation.

A pressurized molecular oxygen supply 17 is connected through a pressure regulating valve 18 and a flowmeter 19 to manifold 12. Also connected to manifold 12 through a three-way solenoid valve 20 and a flow monitoring device 21 is a liquid supply 22 of pure or mixed organohalides maintained under own vapor pressure. A vacuum gauge 25 provides an indication of total reaction pressure in reactor 11.

In operation the manifold 12 and the flow lines are first evacuated, the photomask plate to be processed is placed within reactor 11 and then a mixture of oxygen and organohalide vapor is admitted to reaction chamber 11 where the inductively coupled radio frequency energy creates a cold plasma. If a gaseous (as opposed to a liquid) halogen containing compound is utilized, it will be apparent the oxygen and halogen containing compound, may, if desired, be supplied from a common, premixed, pressurized source. Such a reaction system is commercially available from the Process Control Device of LFE Corporation, under the trade designation PCrE 501AQ. Typically, the rf power employed is between 300 and 400 watts continuous radiation at 13.5 MHz.

The general process is one in which a plurality of photomask plates, at an appropriate state of the manufacturing process, are placed in reactor 11 and exposed to the plasma generated by the admission of a gaseous mixture of oxygen and a suitable halogen containing compound. For the appropriate reactions to take place, the reaction chamber is evacuated prior to the admission of the gaseous etchant. The process provides controllable and uniform etching of metallic films for a production batch of photomask plates with negligible loss of organic (photoresist) etch mask.

In FIG. 2 there is shown in cross-sectional view a portion of a typical semiconductor photomask plate at a suitable processing stage for the utilization of this invention. The photomask plate consists of a glass material 30, such as soda glass, having a relatively thin (600–1000A) layer of a metallic layer 32 (e.g., chromium) either vapor-deposited or sputtered onto it. This metallic layer 32 is to be etched at the openings 34 and 36 in the overlying photoresist mask 38. These openings or windows in the etch mask 38 may represent fractional areas ranging from less than 1 percent up to 90 percent of the total area of the photomask plate, and correspond to positions where it is desired to form semiconductor junctions, etc., by subsequent processing of the semiconducting material.

If the photomask plate, as depicted in FIG. 2, is exposed to the prescribed plasma formed from a gaseous mixture of oxygen and an inorganic or organic halogen containing gas or vapor, the photoresist material will stay intact while the exposed metallic film 32 will be etched down to the glass substrate 30 in openings 34 and 36. It has been found that an effective halocarbon should be selected from the group of organohalides having no more than two carbon atoms per molecule and in which the carbon atoms are attached to a predominance of chlorine atoms. If a liquid halocarbon is considered, it should have a boiling point between 20° and 120°C associated with a vapor pressure of at least 50 torr at 25°C. On the other hand, an effective inorganic halogen containing structure should be selected from a chemical group having a predominance of chlorine atoms per molecule. Such preferred structures may include chlorine gas, hydrogen chloride gas, boron tri chloride, phosphorous pentachloride, etc. The preferred liquid halocarbon is ethylene trichloride and in practice it is supplied as being under its own vapor pressure. The corresponding preferred binary mixture consists of 39.5% by volume of ethylene trichloride vapor and 60.5% oxygen gas. However, satisfactory results were achieved also with other liquid organohalides, for example, 1, 1, 2-trichloro-1,2,2-trifluoroethane, carbon tetrachloride, trichlorofluoromethane, and various mixtures thereof.

The successful operation of this process is believed to include competitive reactions in the plasma, such that relatively low boiling oxychlorides of the corresponding metals are formed which in turn are volatile at the ambient temperatures ( 300°C) normally encountered in these systems. (This is in sharp contrast to the relatively high boiling points of pure chlorides of the corresponding metals at the same ambient temperatures). The simultaneous abundance of the oxygen gas in the plasma enables the preferential formation of the volatile oxychlorides over the straight, nonvolatile chlorides of the metals. Active oxygen is believed to be a main precursor in converting the various metallic layers mentioned to volatile oxyhalide derivatives that escape with the main gas stream to the pump. In general, for the organic chemical structures in the aforementioned group, an increase in the number of carbon atoms per molecule tends to slow down the etching process, while an increase in the mole fraction of oxygen to about 0.7 tends to result in an excessive etch rate of the metallic layer 32 with associated degradation of the photoresist mask and its line-line resolution. Increasing the mole fraction of the halocarbon over that of oxygen beyond 0.45 tends to appreciably reduce the average etch rate. For the inorganic halogen containing structures, an increase in the number of halogens other than chlorine in the molecule tends to slow down the etching process. While in general an increase in the mole fraction of oxygen to 0.73 tends to result in an excessive etch rate, increasing the mole fraction of the halogen containing structure beyond 0.4 tends to substantially reduce the average etch rate.

It has been found that the mixtures and operating parameters set forth below produce acceptable results in the described process. These parameters are intended to optimize the etch rate of metallic films at negligible loss or degradation of any commercially available organic photoresist etch masks. Different gaseous flow rates, rf power levels, etc., may enable correspondingly higher etch rates which may be used in the absence of organic etch masks for gross etching of the metallic film. Values are given for a single reaction chamber loaded with a single photomask plate coated with 800A of chromium metal partially masks by 3500A of Shipley AZ 1350 photoresist. The system is evacuated by a mechanical vacuum pump equipped with a suitable foreline trap. Typical total reaction pressures range from 0.05 to a few torr and reaction temperatures are within 250°–260°C.

EXAMPLE 1.

| Etchant | Etchant Fraction (% in gas phase) | Oxygen Fraction (%) | RF Power (W) | Etch Rate (A/min) |
|---|---|---|---|---|
| Ethylene trichloride | 26 | 74 | 300 | 95 |
| " | 31 | 69 | 300 | 115 |
| " | 39.5 | 60.5 | 300 | 150 |
| " | 42 | 58 | 300 | 105 |
| " | 42 | 58 | 200 | 73 |
| " | 42 | 58 | 100 | 32 |
| " | 58 | 42 | 300 | 32 |

EXAMPLE 2.

| Etchant | Etchant Fraction (% in gas phase) | Oxygen Fraction (%) | RF Power (W) | Etch Rate (A/min) |
|---|---|---|---|---|
| Carbon Tetrachloride | 27.25 | 72.75 | 200 | 80 |
| " | 27.25 | 72.75 | 100 | 32 |
| " | 40.00 | 60.00 | 175 | 170 |
| " | 43.75 | 56.25 | 250 | 200 |
| " | 46.6 | 53.4 | 150 | 135 |
| " | 50.0 | 50.0 | 125 | 170 |

EXAMPLE 3.

| | Etchant Fraction | $O_2$ Fraction | RF Power | Etch Rate |

EXAMPLE 1. -continued

| Etchant | Etchant Fraction (% in gas phase) (%) | Oxygen Fraction (%) | RF Power (W) | Etch Rate (A/min) |
|---|---|---|---|---|
| Chlorine Gas | 21 | 79 | 300 | 150 |
| '' | 31 | 69 | 300 | 200 |
| '' | 41 | 59 | 300 | 155 |
| '' | 58 | 42 | 300 | 50 |
| Boron trichloride | 19 | 81 | 300 | 145 |
| '' | 33 | 67 | 300 | 220 |
| '' | 43 | 57 | 300 | 155 |
| '' | 61 | 39 | 300 | 45 |
| Phosphorous Pentachloride | 20 | 80 | 300 | 130 |
| '' | 35 | 65 | 300 | 195 |
| '' | 55 | 45 | 300 | 45 |

What is claimed is:

1. In a plasma process for chemically etching metallic material in the presence of organic material without significant degradation of the organic material, the improvement comprising the step of:
   exposing the material to a gaseous plasma to form volatile oxychloride derivatives as products within the temperature range 25° to 350° Centigrade wherein said gaseous plasma is formed from a mixture of oxygen and a halogen containing gas selected from one of the following groups, chlorine gas, inorganic chlorine containing compounds capable of forming volatile oxychloride derivatives as products within the temperature range 25° to 350° Centigrade, and a halocarbon vapor or gas having no more than two carbon atoms per molecule, wherein at least one carbon atom in said molecule is linked to a predominance of chlorine atoms.

2. In a plasma process for chemically etching metallic material in the presence of organic material without significant degradation of the organic material, the improvement comprising the step of:
   exposing the material to a gaseous low temperature plasma to form volatile oxychloride derivatives as products within the temperature range 25° to 350° Centigrade and wherein said gaseous low temperature plasma is formed from a mixture of oxygen and a halocarbon vapor or gas having no more than two carbon atoms per molecule, wherein at least one carbon atom in said molecule is linked to a predominance of chlorine atoms.

3. A process for chemically converting material in a plasma environment in accordance with claim 2 wherein said halocarbon has only one carbon atom per molecule, said carbon atom being linked to a predominance of chlorine atoms.

4. A process as in claim 2 wherein said halocarbon includes at least one hydrogen atom.

5. A process as in claim 1 wherein said halogen containing gas and said oxygen are supplied to a reactor from separate sources.

6. A process as in claim 1 wherein said oxygen and said halogen containing gas exclusive of said halocarbon vapor are supplied to a reactor from a common premixed source.

7. A process as in claim 2 wherein said gaseous mixture contains 39.5 percent oxygen and 60.5 percent ethylene trichloride by gas phase volume, said mixture being supplied to said reactor building up a total reaction pressure in the range of 0.05 to 5 torr, and having at least 20 watts rf energy coupled to said mixture.

8. A composition of matter useful for chemically converting material in a plasma environment comprised of a mixture of oxygen and halogen containing gas selected from one of the following groups, chlorine gas, inorganic chlorine containing compounds capable of forming volatile oxychloride derivatives as products within the temperature range 25° to 350° Centigrade, and a halocarbon vapor or gas having no more than two carbon atoms per molecule, wherein at least one carbon atom in said molecule is linked to a predominance of chlorine atoms, wherein said mixture contains 25 to 80% oxygen by volume.

9. A composition of matter, useful for chemically converting material in a plasma environment, comprised of a binary gaseous mixture of oxygen and a halocarbon having no more than two carbon atoms per molecule, wherein at least one carbon atom in said molecule is linked to a predominance of chlorine atoms, and wherein said mixture contains 25 to 80% oxygen by volume.

10. A composition of matter, in accordance with claim 9 wherein said halocarbon is ethylene trichloride.

11. A composition of matter in accordance with claim 9 wherein said halocarbon is carbon tetrachloride.

12. A composition of matter in accordance with claim 9 wherein said halocarbon is trichlorofluoromethane.

13. A composition of matter, in accordance with claim 9 wherein said halocarbon is 1,1,2-trichloro-1,2,2-trifluoroethane.

14. A composition of matter, useful in a process for chemically converting material by forming oxychloride-based compounds volatile in a low pressure, low temperature plasma, comprise of a ternary gaseous mixture of oxygen, ethylene trichloride, and carbon tetrachloride, and wherein said mixture contains 25% to 80% oxygen by volume.

15. A composition of matter, useful in a process for chemically converting material by forming oxychloride-based compounds volatile in a low pressure, low temperature plasma, comprised of a ternary gaseous mixture of oxygen, ethylene trichloride, and trichlorofluoromethane, and wherein said mixture contains 25% to 80% oxygen by volume.

16. A composition of matter, useful in a process for chemically converting material by forming oxychloride-based compounds volatile in a low pressure, low temperature plasma, comprised of a ternary gaseous mixture of oxygen, carbon tetrachloride, and trichlorofluoromethane, and wherein said mixture contains 25% to 80% oxygen by volume.

17. A composition of matter, useful in a process for chemically converting material by forming oxychloride based compounds volatile in a low pressure, low temperature plasma, comprised of a ternary gaseous mixture of oxygen, carbon tetrachloride and 1, 1, 2-trichloro-1, 2, 2-trifluoroethane, and wherein said mixture contains 25% to 80% oxygen by volume.

18. A composition of matter useful in a process for chemically converting material by forming oxychloride based compounds volatile in a low pressure, low temperature plasma comprised of a ternary gaseous mixture of oxygen, ethylene trichloride and 1, 1, 2-trichloro-1, 2, 2-trifluoroethane, and wherein said mixture contains 25% to 80% oxygen by volume.

19. A composition of matter useful in a process for chemically converting material by forming oxychloride based compounds volatile in a low pressure, low temperature plasma comprised of a ternary gaseous mixture of oxygen, trichlorofluoromethane and 1, 1, 2-trichloro-1, 2, 2-trifluoroethane, and wherein said mixture contains 25% to 85% oxygen by volume.

20. In a plasma process for etching metallic material in the presence of an organic etch mask without significant degradation of the organic etch mask, the improvement comprising; the step of exposing the material and the organic etch mask to a low temperature, low pressure gaseous plasma to form volatile oxychloride derivatives as products within the temperature range 25° to 350° Centigrade and wherein the low pressure gaseous plasma is formed from a mixture of oxygen and a halogen containing gas selected from one of the following groups, chlorine gas, inorganic chlorine compounds capable of forming volatile oxychloride derivatives as products within the temperature range 25° to 350° Centigrade, and a halocarbon vapor or gas having no more than two carbon atoms per molecule, wherein at least one carbon atom in said molecule is linked to a predominance of chlorine atoms.

21. A process for chemically converting materials in a plasma environment, comprising the step of exposing the material to a gaseous low pressure, low temperature plasma formed from a binary mixture of chlorine gas and oxygen wherein oxygen comprises between 40% and 80% of said mixture.

22. A process for chemically etching metallic materials in the presence of organic materials without significant degradation of the organic materials in a plasma environment comprising the step of:
exposing the material to a low pressure, gaseous plasma formed from a binary mixture of oxygen and inorganaic chloride gas or vapor and thereby forming volatile oxychloride based compounds within the temperature range of 25° to 350° Centigrade.

23. A process in accordance with claim 22 wherein said chloride is boron trichloride.

24. A process in accordance with claim 22 wherein said chloride is phosphorous pentachloride.

25. A composition of matter, useful for chemically converting material in a plasma environment comprising, a binary mixture of oxygen and inorganic chloride gas, wherein said inorganic chloride gas comprises from 20% to 60% of said mixture.

26. A composition in accordance with claim 25 wherein said inorganic halide is boron trichloride.

27. A composition in accordance with claim 25 wherein said inorganic chloride is phosphorous pentachloride.

* * * * *

UNITED STATES PATENT AND TRADEMARK OFFICE
CERTIFICATE OF CORRECTION

PATENT NO. : 3,951,709
DATED : April 20, 1976
INVENTOR(S) : Adir Jacob

It is certified that error appears in the above-identified patent and that said Letters Patent are hereby corrected as shown below:

Column 2, line 60 "Device" should read --Division--;

Column 4, line 5 "( 300°C) should read --($\leq$ 300°C);

Column 4, line 44 "masks" should read --masked--;

Please delete the last line on the page containing Columns 3 and 4 reading:

"Example 3.

Etchant Fraction   $O_2$ Fraction   RF Power   Etch Rate";

The example at the top of the page containing Columns 5 and 6 reading:

"Example 1.

| Etchant | Etchant Fraction (% in gas phase) | Oxygen Fraction (%) | RF Power (W) | Etch Rate (A/min) |
|---|---|---|---|---|
| Etchant | (%) | (%) | (W) | (A/min) |
| Chlorine Gas | 21 | 79 | 300 | 150 |
| " " | 31 | 69 | 300 | 200 |
| " " | 41 | 59 | 300 | 155 |
| " " | 58 | 42 | 300 | 50 |
| Boron trichloride | 19 | 81 | 300 | 145 |
| " " | 33 | 67 | 300 | 220 |
| " " | 43 | 57 | 300 | 155 |
| " " | 61 | 39 | 300 | 45 |
| Phosphorous Pentachloride | 20 | 80 | 300 | 130 |
| | 35 | 65 | 300 | 195 |
| " " | 55 | 45 | 300 | 45 |

"

UNITED STATES PATENT AND TRADEMARK OFFICE
CERTIFICATE OF CORRECTION

PATENT NO. : 3,951,709
DATED : April 20, 1976
INVENTOR(S) : Adir Jacob

It is certified that error appears in the above-identified patent and that said Letters Patent are hereby corrected as shown below:

should read:

--Example 3.

| Etchant | Etchant Fraction (%) | $O_2$ Fraction (%) | RF Power (W) | Etch Rate (A/min) |
|---|---|---|---|---|
| Chlorine Gas | 21 | 79 | 300 | 150 |
| " " | 31 | 69 | 300 | 200 |
| " " | 41 | 59 | 300 | 155 |
| " " | 58 | 42 | 300 | 50 |
| Boron trichloride | 19 | 81 | 300 | 145 |
| " " | 33 | 67 | 300 | 220 |
| " " | 43 | 57 | 300 | 155 |
| " " | 61 | 39 | 300 | 45 |
| Phosphorous Pentachloride | 20 | 80 | 300 | 130 |
| | 35 | 65 | 300 | 195 |
| " " | 55 | 45 | 300 | 45 |

--.

Signed and Sealed this

Thirty-first Day of August 1976

[SEAL]

Attest:

RUTH C. MASON
Attesting Officer

C. MARSHALL DANN
Commissioner of Patents and Trademarks